(12) United States Patent
Song et al.

(10) Patent No.: US 12,219,888 B2
(45) Date of Patent: Feb. 4, 2025

(54) PHASE CHANGE MEMORY AND METHOD FOR MAKING THE SAME

(71) Applicant: SHANGHAI INSTITUTE OF MICROSYSTEM AND INFORMATION TECHNOLOGY, CHINESE ACADEMY OF SCIENCE, Shanghai (CN)

(72) Inventors: Zhitang Song, Shanghai (CN); Sannian Song, Shanghai (CN)

(73) Assignee: SHANGHAI INSTITUTE OF MICROSYSTEM AND INFORMATION TECHNOLOGY, CHINESE ACADEMY OF SCIENCES, Shanghai (CN)

( * ) Notice: Subject to any disclaimer, the term of this patent is extended or adjusted under 35 U.S.C. 154(b) by 431 days.

(21) Appl. No.: 17/607,892

(22) PCT Filed: Nov. 4, 2019

(86) PCT No.: PCT/CN2019/115202
§ 371 (c)(1),
(2) Date: Oct. 31, 2021

(87) PCT Pub. No.: WO2021/003904
PCT Pub. Date: Jan. 14, 2021

(65) Prior Publication Data
US 2022/0231224 A1    Jul. 21, 2022

(30) Foreign Application Priority Data
Jul. 8, 2019  (CN) .......................... 201910610965.5

(51) Int. Cl.
*H10N 70/00*  (2023.01)
*H10B 63/00*  (2023.01)
*H10N 70/20*  (2023.01)

(52) U.S. Cl.
CPC ......... *H10N 70/8616* (2023.02); *H10B 63/24* (2023.02); *H10B 63/80* (2023.02);
(Continued)

(58) Field of Classification Search
CPC ...................................................... H10B 63/80
See application file for complete search history.

(56) References Cited

U.S. PATENT DOCUMENTS 10,381,366 B1    8/2019   Takahashi et al.
2015/0123006 A1*  5/2015   Sinclair ............... H01J 37/3177
                                                         250/492.3
(Continued)

FOREIGN PATENT DOCUMENTS

CN          109560104 A       4/2019
CN          110335942 A       10/2019

*Primary Examiner* — Mounir S Amer
(74) *Attorney, Agent, or Firm* — IPRTOP LLC

(57) ABSTRACT

The present disclosure provides a phase change memory and a method for making the same. The phase change memory includes a substrate, a plurality of phase change memory cells, and an isolation material layer. The plurality of phase change memory cells are separately disposed on the substrate, the phase change memory cell sequentially includes, from bottom to top, a first electrode material layer, a first transition material layer, an ovonic threshold switching (OTS) material layer, a second transition material layer, a second electrode material layer, a third transition material layer, a phase change material layer, a fourth transition material layer, and a third electrode material layer; The isolation material layer is disposed on the substrate and surrounds side surfaces of the phase change memory cell, and the plurality of phase change memory cells are isolated from each other by isolation material layer.

17 Claims, 5 Drawing Sheets

(52) U.S. Cl.
CPC ......... *H10N 70/063* (2023.02); *H10N 70/231* (2023.02); *H10N 70/841* (2023.02); *H10N 70/8828* (2023.02)

(56) References Cited

U.S. PATENT DOCUMENTS

| | | | |
|---|---|---|---|
| 2015/0123066 A1* | 5/2015 | Gealy | H10N 70/231 257/4 |
| 2016/0108348 A1* | 4/2016 | Franklin | H10N 70/826 510/175 |
| 2018/0342557 A1 | 11/2018 | Mori | |
| 2018/0374899 A1 | 12/2018 | Yoshida et al. | |
| 2019/0259946 A1 | 8/2019 | Makala et al. | |

* cited by examiner

PHASE CHANGE MEMORY AND METHOD FOR MAKING THE SAME

CROSS REFERENCE TO RELATED PATENT APPLICATION

The present application is the US national stage of PCT/CN2019/115202 filed on 2019 Nov. 4, which claims the priority of the Chinese patent application No. 201910610965.5 filed on 2019 Jul. 8, which application is incorporated herein by reference.

CROSS REFERENCE TO RELATED APPLICATION

Not Applicable

BACKGROUND

Field of Disclosure

The present disclosure relates to the technical field of microelectronic, in particular, to a phase change memory and a method for making the same.

Description of Related Arts

In the traditional computing architecture, the significant performance difference between dynamic random access memory (DRAM) and NAND Flash makes the response efficiency of data exchange between north and south bridges in large data centers and computers and other equipment low and energy consumption remains high. In recent years, a lot of manpower, material resources, and financial resources have been invested to study new storage technologies by the field of industry and science. Large enterprises represented by IBM, Intel, Micron, and Samsung are all seeking new high-performance storage technologies, called SCM-Storage Class Memory, to fill the performance gap between DRAM and Flash, or to partially replace DRAM and Flash to build a new storage architecture to improve overall performance. Among the new high-performance storage technologies, phase change memory (PCM), magnetic random access memory (MRAM), resistance random access memory (RRAM), and ferroelectric random access memory (FeRAM) are the four most competitive new main storage technologies. PCM has the advantages of non-volatile, good shrinkage performance, compatibility with the CMOS process, long cycle life, high-speed reading, multi-level storage, and radiation resistance, and is considered to be the most promising next-generation non-volatile storage technology. PCM especially has broad market prospects in the application of SCM. The principle of PCM is to use the huge difference in resistivity before and after the material phase transition to achieve data storage. In PCM, the resistivity in one state (i.e. the crystalline state) is low, and the resistivity in the other state (i.e. the amorphous state) is high. The logic "1" or logic "0" depends on the resistance state of the phase change material. Internationally, large companies such as Intel, Micron, Samsung, TSMC and STMicroelectronics are carrying out research and industrialization of PCM memory.

When used as an SCM, PCM is required to have high density, high speed, low power consumption, and long life. At present, only Intel and Micron have developed a phase change memory 3D Xpoint suitable for SCM. However, Intel and Micron have not disclosed which materials are used to prepare their phase change memory cells and OTS units, and the device performance has not been disclosed. Therefore, it is very important to research and develop phase change memory materials and structures with independent intellectual property rights.

In view of this, it is necessary to propose a new technical solution to achieve a phase change memory with high density, low power consumption, and high stability to meet the application requirements of SCM.

SUMMARY OF THE PRESENT DISCLOSURE

The present disclosure provides a method for making a phase change memory, to solve the problem that the phase change memory in the prior art cannot meet the application requirements of the storage memory.

The present disclosure provides a method for making a phase change memory. The method includes: preparing a substrate, and forming a laminated structure on the substrate, the laminated structure sequentially includes, from bottom to top, a first electrode material layer, a first transition material layer, an OTS material layer, a second transition material layer, a second electrode material layer, a third transition material layer, a phase change material layer, a fourth transition material layer, and a third electrode material layer; fabricating an isolation groove in the laminated structure, the isolation groove extends from a top surface of the laminated structure downwards to a surface of the substrate to separate the laminated structure into a plurality of columnar structures; and forming an isolation material layer in the isolation groove, and the isolation material layer surrounds side surfaces of the columnar structure.

Optionally, a material of the first transition material layer, the second transition material layer, the third transition material layer, and the fourth transition material layer respectively includes at least one of C, Ta, TaC, TaN, Nb, NbN, and SiC.

Optionally, a thickness of the first transition material layer ranges from 2 to 10 nm, a thickness of the second transition material layer ranges from 2 to 10 nm, a thickness of the third transition material layer ranges from 2 to 10 nm, and a thickness of the fourth transition material layer ranges from 2 to 10 nm.

Optionally, a method of forming the first electrode material layer, the first transition material layer, the OTS material layer, the second transition material layer, the second electrode material layer, the third transition material layer, the phase change material layer, the fourth transition material layer, and the third electrode material layer includes at least one of a sputtering method, an evaporation method, an atomic layer deposition method, a chemical vapor deposition method, a metal organic thermal decomposition method, and a laser-assisted deposition method.

Optionally, the method of forming the isolation groove includes reactive ion etching.

Optionally, a material of the OTS material layer comprises a sulfur-based compound material with switching characteristics, the sulfur-based compound material includes one of Ge—Se series materials, Ge—As—Se series materials, Ge—As—Se—Si series materials, Ge—As—Se—Si—Te series materials, and Ge—As—Se—Si—N series materials, or a compound obtained by doping one of the above materials with one or two of N and C.

Optionally, a material of the phase change material layer includes a sulfur-based compound material with phase change characteristics, the sulfur-based compound material includes one of $Sb_2Te_3$, $Sb_2Te$ and $Ge_2Sb_2Te_5$, or a compound obtained by doping one of the above materials with one or two of Ta, Hf and C.

Optionally, a material of the first electrode material layer, the second electrode material layer, and the third electrode material layer respectively includes at least one of W, TiN, TiSiN, and AlN.

The present disclosure further provides a phase change memory, which includes: a substrate; a plurality of phase change memory cells disposed on the substrate, the phase change memory cell sequentially includes, from bottom to top, a first electrode material layer, a first transition material layer, an OTS material layer, a second transition material layer, a second electrode material layer, a third transition material layer, a phase change material layer, a fourth transition material layer, and a third electrode material layer; and an isolation material layer disposed on the substrate and surrounding a side surface of the phase change memory cell, and the plurality of phase change memory cells are isolated from each other by the isolation material layer.

Optionally, in the phase change memory cell, cross-sectional areas of the phase change material layer and the threshold gating transistor material layer are the same.

Optionally, a material of the first transition material layer, the second transition material layer, the third transition material layer, and the fourth transition material layer respectively includes at least one of C, Ta, TaC, TaN, Nb, NbN, and SiC.

Optionally, a thickness of the first transition material layer ranges from 2 to 10 nm, a thickness of the second transition material layer ranges from 2 to 10 nm, a thickness of the third transition material layer ranges from 2 to 10 nm, and a thickness of the fourth transition material layer ranges from 2 to 10 nm.

Optionally, a material of the OTS material layer comprises a sulfur-based compound material with switching characteristics, the sulfur-based compound material includes one of Ge—Se series materials, Ge—As—Se series materials, Ge—As—Se—Si series materials, Ge—As—Se—Si—Te series materials, and Ge—As—Se—Si—N series materials, or a compound obtained by doping one of the above materials with one or two of N and C.

Optionally, a material of the phase change material layer includes a sulfur-based compound material with phase change characteristics, the sulfur-based compound material includes one of $Sb_2Te_3$, $Sb_2Te$ and $Ge_2Sb_2Te_5$, or a compound obtained by doping one of the above materials with one or two of Ta, Hf and C.

Optionally, a material of the first electrode material layer, the second electrode material layer, and the third electrode material layer respectively includes at least one of W, TiN, TiSiN, and AlN.

As described above, in the phase change memory of the present disclosure, the material of the transition layer has a low thermal conductivity, which can improve the thermal efficiency of the phase change memory, thereby reducing the power consumption of the phase change memory cell. The material of the transition layer has good thermal stability, and has good adhesion to dielectric materials, phase change materials, ovonic threshold switch (OTS) materials and electrode materials, which can prevent the mutual diffusion between electrode materials, phase change materials, and OTS materials, thereby improving adhesion and increasing cycle life. The material of the transition layer has good conductive properties, which can avoid the introduction of large resistance. Since the phase change material and the OTS material are limited between the dielectric materials, this structure can avoid the diffusion and volatilization of elements of the phase change material and the OTS material during operation, which is beneficial to prolong the life of the device. The transition layer avoids the diffusion of elements at the interface, and at the same time reduces the heat loss during operation, which is beneficial to the reduction of power consumption of the device. High density can be achieved by reducing the size of phase change materials and OTS materials. Therefore, the phase change memory of the present disclosure has the characteristics of high density, high speed, low power consumption and long life.

DESCRIPTION OF COMPONENT MARK NUMBERS

| | |
|---|---|
| 1 | Substrate |
| 2 | First electrode material layer |
| 3 | First transition material layer |
| 4 | OTS material layer |
| 5 | Second transition material layer |
| 6 | Second electrode material layer |
| 7 | Third transition material layer |
| 8 | Phase change material layer |
| 9 | Fourth transition material layer |
| 10 | Third electrode material layer |
| 11 | Isolation groove |
| 12 | Insulation material layer |

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

Referring to FIGS. 1 to 12. It needs to be stated that the drawings provided in it the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

Embodiment 1

Figure 1:
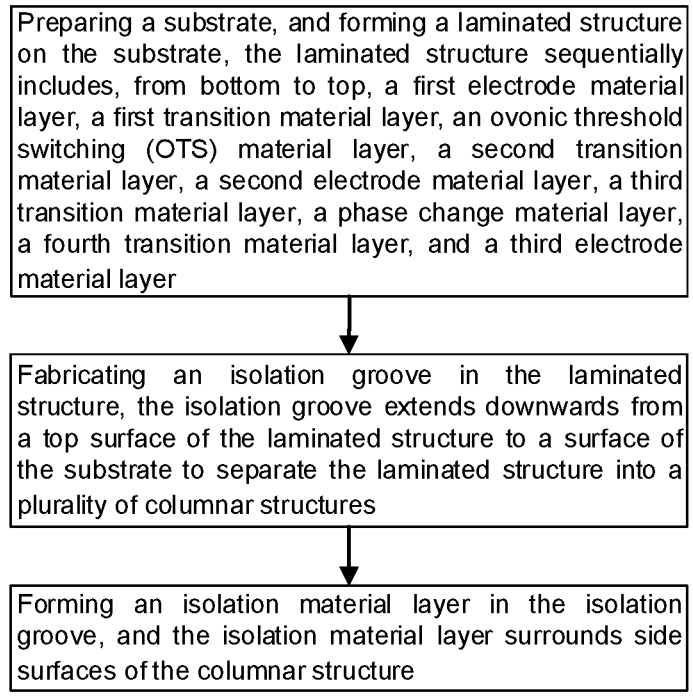
FIG. 1 shows a flow chart of a method for making a phase change memory according to the present disclosure.

The present disclosure provides a method for making a phase change memory. FIG. 1 shows a process flowchart of the method. The method includes the following operations:

S1: preparing a substrate, and forming a laminated structure on the substrate, the laminated structure sequentially includes, from bottom to top, a first electrode material layer, a first transition material layer, an ovonic threshold switching (OTS) material layer, a second transition material layer, a second electrode material layer, a third transition material layer, a phase change material layer, a fourth transition material layer, and a third electrode material layer.

S2: fabricating an isolation groove in the laminated structure, the isolation groove extends downwards from a top surface of the laminated structure to a surface of the substrate to separate the laminated structure into a plurality of columnar structures.

S3: forming an isolation material layer in the isolation groove, and the isolation material layer surrounds side surfaces of the columnar structure.

Referring to FIGS. 2 to 10, the operation S1 is performed to form the laminated structure on the substrate 1.

As an example, the substrate 1 includes but is not limited to semiconductor materials such as Si, Ge, SiGe, III-V group compounds, and the like. In this embodiment, a Si substrate is used as an example, the Si substrate is cleaned by using an acetone solution and an alcohol solution for 3 minutes respectively under the action of ultrasonic waves, and then baked at 120° C. for 20 minutes. The cleaning helps to improve the deposition quality of subsequent films. For different substrates, the cleaning method may be different. As long as the cleaning method can obtain a clean substrate surface, the protection scope of the present disclosure should not be excessively limited here.

Figure 2:
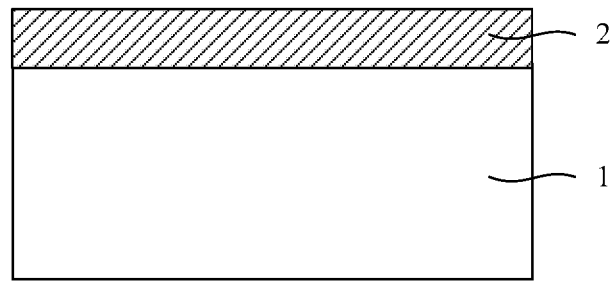
FIG. 2 shows a schematic view of forming a first electrode material layer on the substrate according to the method for making a phase change memory of the present disclosure.

As an example, the forming of the laminated structure includes the following operations:

Referring to FIG. 2, operation S1-1 is performed: forming a first electrode material layer 2 on the substrate 1.

Specifically, the method of forming the first electrode material layer 2 includes but is not limited to at least one of a sputtering method, an evaporation method, an atomic layer deposition method, a chemical vapor deposition method, a metal organic thermal decomposition method, and a laser-assisted deposition method. The material of the first electrode material layer 2 includes but is not limited to at least one of W, TiN, TiSiN, and AlN. As an example, in this embodiment, the first electrode material layer 2 is deposited using a magnetron sputtering method. The thickness of the first electrode material layer 2 is 50 nm. The background vacuum during sputtering is 4×10−6 Torr, the vacuum during sputtering is 0.18 Pa, and the electrode material used is W.

Figure 3:
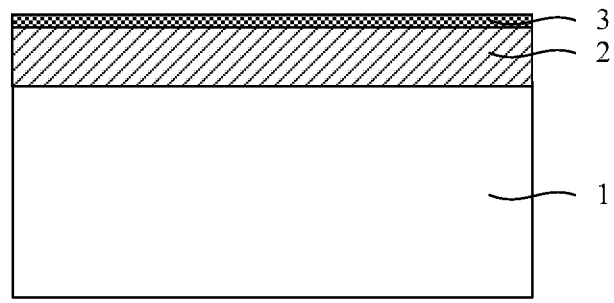
FIG. 3 shows a schematic view of forming a first transition material layer on the first electrode material layer according to the method for making a phase change memory of the present disclosure.

Referring to FIG. 3, operation S1-2 is performed: forming a first transition material layer 3 on the first electrode material layer 2.

Specifically, the method of forming the first transition material layer 3 includes but is not limited to at least one of a sputtering method, an evaporation method, an atomic layer deposition method, a chemical vapor deposition method, a metal organic thermal decomposition method, and a laser-assisted deposition method. The material of the first transition material layer 3 includes but is not limited to at least one of C, Ta, TaC, TaN, Nb, NbN, and SiC, such as one, two, three, or four of them. The thickness of the first transition material layer 3 ranges from 2 to 10 nm. As an example, in this embodiment, the first transition material layer 3 is deposited using a magnetron sputtering method. The thickness of the first transition material layer 3 is 5 nm. The background vacuum during sputtering is 4×10−6 Torr, the vacuum during sputtering is 0.2 Pa, and the material of the first transition material layer is C.

Figure 4:
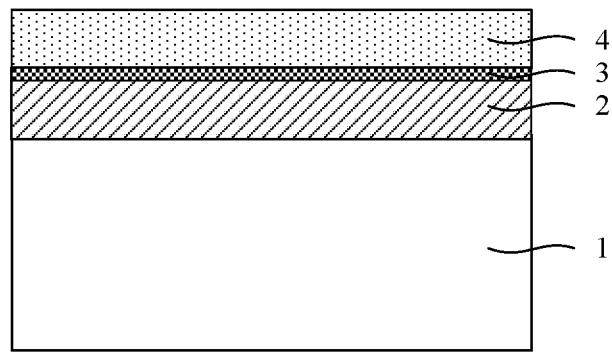
FIG. 4 shows a schematic view of forming an OTS material layer on the first transition material layer according to the method for making a phase change memory of the present disclosure.

Referring to FIG. 4, operation S1-3 is performed: forming an OTS material layer 4 on the first transition material layer 3.

Specifically, a material of the OTS material layer includes but is not limited to a sulfur-based compound material with switching characteristics. The sulfur-based compound material includes one of Ge—Se series materials, Ge—As—Se series materials, Ge—As—Se—Si series materials, Ge—As—Se—Si—Te series materials, and Ge—As—Se—Si—N series materials, or a compound obtained by doping one of the above materials with one or two of N and C elements. As an example, in this embodiment, the OTS material is deposited using a magnetron sputtering method. The thickness of the deposited OTS material is 30 nm. The background vacuum during sputtering is 4×10−6 Torr, the vacuum during sputtering is 0.2 Pa, and the OTS materials used are Ge—As—Se—Te series materials.

Figure 5:
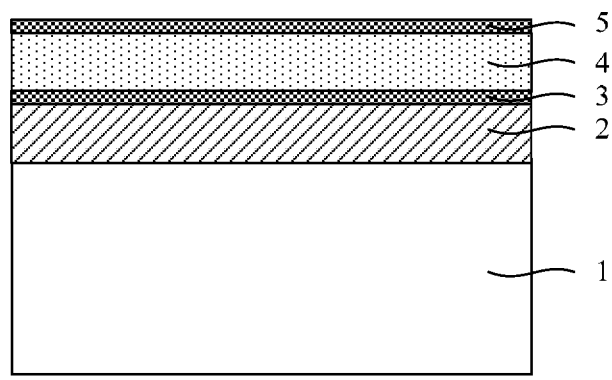
FIG. 5 shows a schematic view of forming a second transition material layer on the OTS material layer according to the method for making a phase change memory of the present disclosure.

Referring to FIG. 5, operation S1-4 is performed: forming a second transition material layer 5 on the threshold gating transistor material layer 4.

Specifically, the method of forming the second transition material layer 5 includes but is not limited to at least one of a sputtering method, an evaporation method, an atomic layer deposition method, a chemical vapor deposition method, a metal organic thermal decomposition method, and a laser-assisted deposition method. The material of the second transition material layer 5 includes but is not limited to at least one of C, Ta, TaC, TaN, Nb, NbN, and SiC, such as one, two, three, or four of them. The thickness of the second transition material layer 5 ranges from 2 to 10 nm. As an example, in this embodiment, the second transition material layer is deposited using a magnetron sputtering method. The thickness of the second transition material layer is 5 nm. The background vacuum during sputtering is $4\times10-6$ Torr, the vacuum during sputtering is 0.2 Pa, and the material of the second transition material layer is C.

Figure 6:
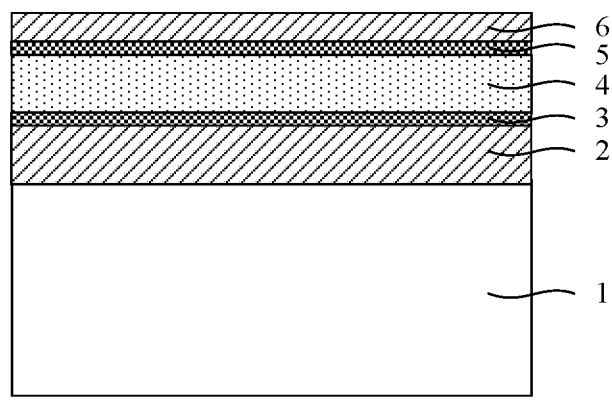
FIG. 6 shows a schematic view of forming a second electrode material layer on the second transition material layer according to the method for making a phase change memory of the present disclosure.

Referring to FIG. 6, operation S1-5 is performed: forming a second electrode material layer 6 on the second transition material layer 5.

Specifically, the method of forming the second electrode material layer 6 includes but is not limited to at least one of a sputtering method, an evaporation method, an atomic layer deposition method, a chemical vapor deposition method, a metal organic thermal decomposition method, and a laser-assisted deposition method. The material of the second electrode material layer 6 includes but is not limited to at least one of W, TiN, TiSiN, and AlN. As an example, in this embodiment, the second electrode material layer 6 is deposited using a magnetron sputtering method. The thickness of the second electrode material layer 2 is 20 nm. The background vacuum during sputtering is $4\times10-6$ Torr, the vacuum during sputtering is 0.2 Pa, and the electrode material used is TiN.

Figure 7:
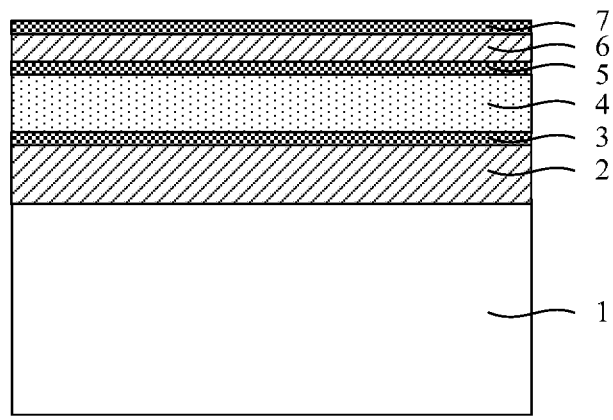
FIG. 7 shows a schematic view of forming a third transition material layer on the second electrode material layer according to the method for making a phase change memory of the present disclosure.

Referring to FIG. 7, operation S1-6 is performed: forming a third transition material layer 7 on the second electrode material layer 6.

Specifically, the method of forming the third transition material layer 7 includes but is not limited to at least one of a sputtering method, an evaporation method, an atomic layer deposition method, a chemical vapor deposition method, a metal organic thermal decomposition method, and a laser-assisted deposition method. The material of the third transition material layer 7 includes but is not limited to at least one of C, Ta, TaC, TaN, Nb, NbN, and SiC, such as one, two, three, or four of them. The thickness of the third transition material layer 7 ranges from 2 to 10 nm. As an example, in this embodiment, the third transition material layer 7 is deposited using a magnetron sputtering method. The thickness of the third transition material layer 7 is 5 nm. The background vacuum during sputtering is $4\times10-6$ Torr, the vacuum during sputtering is 0.2 Pa, and the material of the third transition material layer is TaC.

Figure 8:
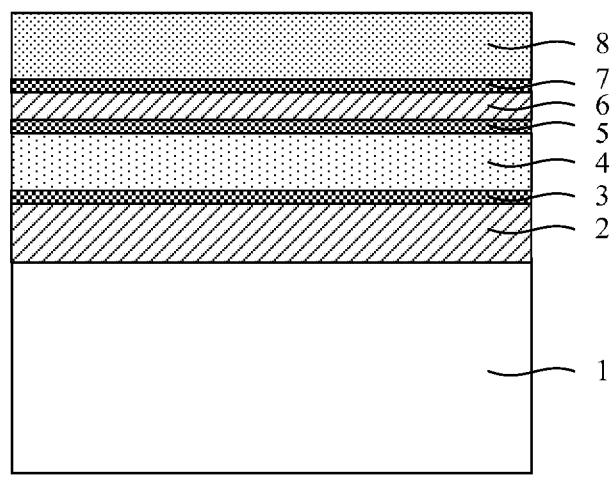
FIG. 8 shows a schematic view of forming a phase change material layer on the third transition material layer according to the method for making a phase change memory of the present disclosure.

As shown in FIG. 8, operation S1-7 is performed: forming a phase change material layer 8 on the third transition material layer 7.

Specifically, the method of forming the phase change material layer 8 includes but is not limited to at least one of a sputtering method, an evaporation method, an atomic layer deposition method, a chemical vapor deposition method, a metal organic thermal decomposition method, and a laser-assisted deposition method. The material of the phase change material layer 8 includes but is not limited to a sulfur-based compound material with phase change characteristics, the sulfur-based compound material includes one of $Sb_2Te_3$, $Sb_2Te$ and $Ge_2Sb_2Te_5$, or a compound obtained by doping one of $Sb_2Te_3$, $Sb_2Te$ and $Ge_2Sb_2Te_5$ with one or two of Ta, Hf and C. As an example, in this embodiment, the phase change material is deposited using a magnetron sputtering method. The thickness of the deposited a phase change material is 50 nm. The background vacuum during sputtering is $4\times10-6$ Torr, the vacuum during sputtering is 0.2 Pa, and the phase change material used is Ta—Sb—Te series material.

Figure 9:
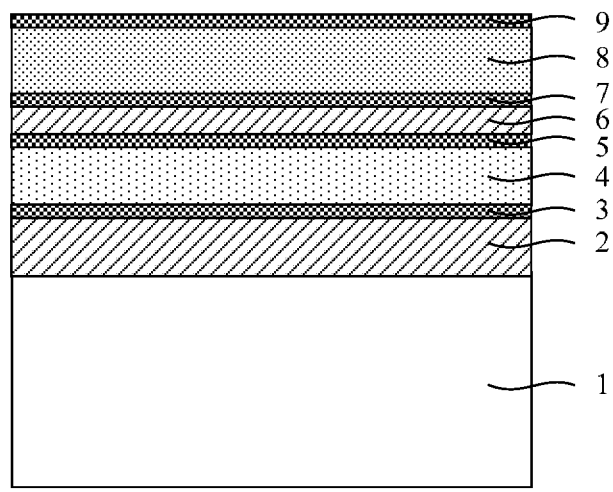
FIG. 9 shows a schematic view of forming a fourth transition material layer on it the phase change material layer according to the method for making a phase change memory of the present disclosure.

Referring to FIG. 9, operation S1-8 is performed: forming a fourth transition material layer 9 on the phase change material layer 8.

Specifically, the method of forming the fourth transition material layer 9 includes but is not limited to at least one of a sputtering method, an evaporation method, an atomic layer deposition method, a chemical vapor deposition method, a metal organic thermal decomposition method, and a laser-assisted deposition method. The material of the fourth transition material layer 9 includes but is not limited to at least one of C, Ta, TaC, TaN, Nb, NbN, and SiC, such as one, two, three, or four of them. The thickness of the fourth transition material layer 9 ranges from 2 to 10 nm. As an example, in this embodiment, the fourth transition material layer 9 is deposited using a magnetron sputtering method. The thickness of the fourth transition material layer 9 is 5 nm. The background vacuum during sputtering is $4\times10-6$ Torr, the vacuum during sputtering is 0.2 Pa, and the material of the fourth transition material layer is TaC.

Figure 10:
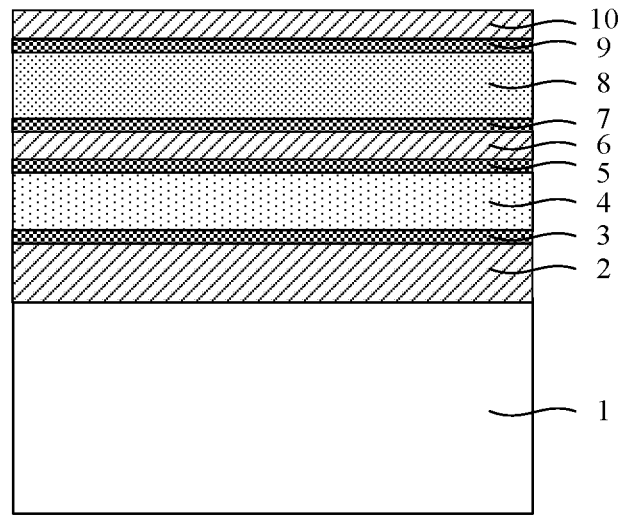
FIG. 10 shows a schematic view of forming a third electrode material layer on the fourth transition material layer according to the method for making a phase change memory of the present disclosure.

Referring to FIG. 10, operation S1-9 is performed: forming a third electrode material layer 10 on the fourth transition material layer 9.

Specifically, the method of forming the third electrode material layer 10 includes but is not limited to at least one of a sputtering method, an evaporation method, an atomic layer deposition method, a chemical vapor deposition method, a metal organic thermal decomposition method, and a laser-assisted deposition method. The material of the third electrode material layer 10 includes but is not limited to at least one of W, TiN, TiSiN, and AlN. As an example, in this embodiment, the third electrode material layer 10 is deposited using a magnetron sputtering method. The thickness of the third electrode material layer 10 is 50 nm. The background vacuum during sputtering is $4\times10-6$ Torr, the vacuum during sputtering is 0.2 Pa, and the electrode material used is TiN.

Thus the laminated structure is obtained on the substrate 1.

Figure 11:
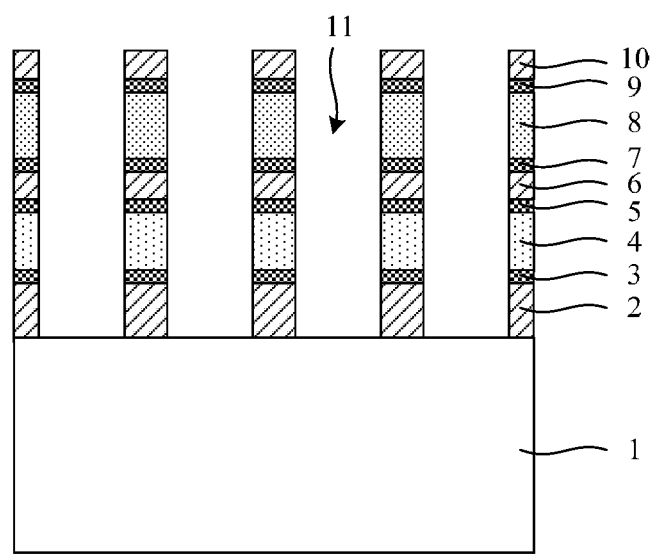
FIG. 11 shows a schematic view of fabricating an isolation groove in the laminated structure according to the method for making a phase change memory of the present disclosure.

Then referring to FIG. 11, operation S2 is performed to fabricate an isolation groove 11 in the laminated structure.

Specifically, the isolation groove 11 extends downwards from a top surface of the laminated structure to a surface of the substrate 1 to separate the laminated structure into a plurality of columnar structures.

As an example, the isolation groove 11 is fabricated using a micro-nano processing technology, which includes ultraviolet exposure, development, stripping method, and reactive ion etching. In this embodiment, the mask pattern is etched using extreme ultraviolet exposure photolithography, and the laminated structure is etched using reactive ions to obtain a plurality of columnar structures, each columnar structure corresponds to a memory cell.

As an example, the cross section of the memory cell is a square with a side length of 100 nm, and the distance between adjacent memory cells is 100 nm. In other embodiments, the cross-sectional shape and arrangement of the memory cells can also be adjusted as needed, and the protection scope of the present disclosure should not be unduly limited here.

Figure 12:
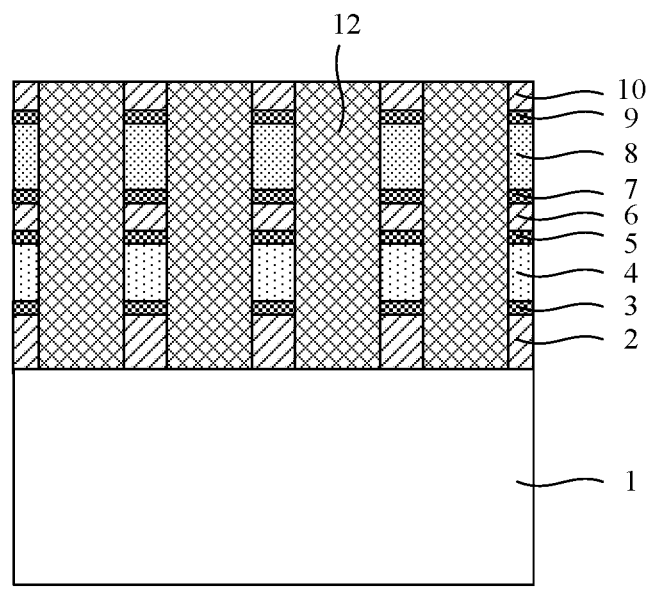
FIG. 12 shows a schematic view of forming an isolation material layer in the isolation groove according to the method for making a phase change memory of the present disclosure.

Referring to FIG. 12, operation S3 is performed to form the isolation material layer 12 in the isolation groove 11.

Specifically, the method of forming the isolation material layer 12 includes but is not limited to at least one of a sputtering method, an evaporation method, an atomic layer deposition method, a chemical vapor deposition method, a metal organic thermal decomposition method, and a laser-assisted deposition method. The material of the isolation material layer 12 includes but is not limited to at least one of Si3N4 and SiO2. As an example, in this embodiment, the Si3N4 isolation material is deposited using the chemical vapor deposition method, and the excess Si3N4 film is removed using a chemical mechanical polishing method.

Then a probe or wire is used to lead out the electrode and load the electric signal to test the various properties of the cell.

Thus, a phase change memory with high density, high speed, low power consumption, and long life has been fabricated. The phase change material and OTS material are confined in the same space by the isolation material, which can avoid the diffusion and volatilization of elements of the phase change material and the OTS material during operation and is beneficial to prolong the life of the device. The transition material layer is located between the phase change material and the electrode material, between the phase change material and the OTS material, and between the OTS material and the electrode material. The material of the transition layer has a low thermal conductivity, which can reduce the heat loss of the device during operation, improve the thermal efficiency of the phase change memory, thereby reducing the power consumption of the phase change memory cell. The material of the transition layer has good thermal stability, and has good adhesion to dielectric materials, phase change materials, OTS materials, and electrode materials, which can prevent the mutual diffusion between electrode materials, phase change materials, and OTS materials, thereby improving adhesion and increasing cycle life. Furthermore, the material of the transition layer has good conductive properties, which can avoid the introduction of large resistance. High density can be achieved by reducing the size of phase change materials and OTS materials.

Embodiment 2

The present disclosure further provides a phase change memory. Referring to FIG. 12, which is a schematic view of a cross-sectional structure of the phase change memory. The phase change memory includes a substrate 1, an isolation material layer 12 and a plurality of phase change memory cells. The plurality of phase change memory cells are separately disposed on the substrate 1, the phase change memory cell has a columnar structure and sequentially includes, from bottom to top, a first electrode material layer 2, a first transition material layer 3, an OTS material layer 4, a second transition material layer 5, a second electrode material layer 6, a third transition material layer 7, a phase change material layer 8, a fourth transition material layer 9, and a third electrode material layer 10. The isolation material layer 12 is disposed on the substrate 1 and surrounds side surfaces of the phase change memory cell. The plurality of phase change memory cells is isolated from each other by the isolation material layer 12.

As an example, in the phase change memory cell, the cross-sectional areas of the phase change material layer 8 and the OTS material layer 4 are the same.

As an example, a material of the first transition material layer 3, the second transition material layer 5, the third transition material layer 7, and the fourth transition material layer 9 respectively includes at least one of C, Ta, TaC, TaN, Nb, NbN, and SiC. The thickness of the first transition material layer 3 ranges from 2 to 10 nm, the thickness of the second transition material layer 5 ranges from 2 to 10 nm, the thickness of the third transition material layer 7 ranges from 2 to 10 nm, and the thickness of the fourth transition material layer 9 ranges from 2 to 10 nm.

As an example, the material of the threshold gating transistor material layer 4 includes a sulfur-based compound material with switching characteristics. The sulfur-based compound material includes but is not limited to one of Ge—Se series materials, Ge—As—Se series materials, Ge—As—Se—Si series materials, Ge—As—Se—Si—Te series materials, and Ge—As—Se—Si—N series materials, or a compound obtained by doping one of the above materials with one or two of N and C elements.

As an example, the material of the phase change material layer 8 includes a sulfur-based compound material with phase change characteristics. The sulfur-based compound material includes but is not limited to one of $Sb_2Te_3$, $Sb_2Te$ and $Ge_2Sb_2Te_5$, or a compound obtained by doping one of $Sb_2Te_3$, $Sb_2Te$ and $Ge_2Sb_2Te_5$ with one or two of Ta, Hf and C.

As an example, a material of the first electrode material layer 2, the second electrode material layer 6, and the third electrode material layer 10 respectively includes at least one of W, TiN, TiSiN, and AlN.

As an example, the material of the isolation material layer 12 includes but is not limited to at least one of Si3N4 and SiO2.

In summary, in the phase change memory of the present disclosure, the material of the transition layer has a low thermal conductivity, which can improve the thermal efficiency of the phase change memory, thereby reducing the power consumption of the phase change memory cell. The material of the transition layer has good thermal stability, and has good adhesion to dielectric materials, phase change materials, OTS materials and electrode materials, which can prevent the mutual diffusion between electrode materials, phase change materials, and OTS materials, thereby improving adhesion and increasing cycle life. The material of the transition layer has good conductive properties, which can avoid the introduction of large resistance. Since the phase change material and the OTS material are limited between the dielectric materials, this structure can avoid the diffusion and volatilization of elements of the phase change material and the OTS material during operation, which is beneficial to prolong the life of the device. The transition layer avoids the diffusion of elements at the interface, and at the same time reduces the heat loss during operation, which is beneficial to the reduction of power consumption of the device. High density can be achieved by reducing the size of phase change materials and OTS materials. Therefore, the phase change memory of the present disclosure has the characteristics of high density, high speed, low power consumption and long life. Therefore, the present disclosure effectively overcomes various shortcomings in the existing technology and has high industrial utilization value.

The above-mentioned embodiments are just used for exemplarily describing to the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

What is claimed is:

1. A method for making a phase change memory, comprising:
preparing a substrate, and forming a laminated structure on the substrate, the laminated structure sequentially includes, from bottom to top, a first electrode material layer, a first transition material layer, an ovonic threshold switching (OTS) material layer, a second transition material layer, a second electrode material layer, a third transition material layer, a phase change material layer, a fourth transition material layer, and a third electrode material layer; wherein the first transition material layer consists of C, the second transition material layer consists of C, the third transition material layer consists of TaC, and the fourth transition material layer consists of TaC;
fabricating an isolation groove in the laminated structure, the isolation groove extends downwards from a top surface of the laminated structure to a surface of the substrate to separate the laminated structure into a plurality of columnar structures; and
forming an isolation material layer in the isolation groove, and the isolation material layer surrounds side surfaces of the columnar structure.

2. The method for making a phase change memory according to claim 1, wherein a thickness of the first transition material layer ranges from 2 to 10 nm, a thickness of the second transition material layer ranges from 2 to 10 nm, a thickness of the third transition material layer ranges from 2 to 10 nm, and a thickness of the fourth transition material layer ranges from 2 to 10 nm.

3. The method for making a phase change memory according to claim 1, wherein a method of forming the first electrode material layer, the first transition material layer, the OTS material layer, the second transition material layer, the second electrode material layer, the third transition material layer, the phase change material layer, the fourth transition material layer, and the third electrode material layer includes at least one of a sputtering method, an evaporation method, an atomic layer deposition method, a chemical vapor deposition method, a metal organic thermal decomposition method, and a laser-assisted deposition method.

4. The method for making a phase change memory according to claim 1, wherein a method for fabricating the isolation groove includes reactive ion etching.

5. The method for making a phase change memory according to claim 1, wherein a material of the OTS material layer comprises a sulfur-based compound material with switching characteristics, the sulfur-based compound material includes one of Ge—Se series materials, Ge—As—Se series materials, Ge—As—Se—Si series materials, Ge—As—Se—Si—Te series materials, and Ge—As—Se—Si—N series materials, or a compound obtained by doping one of the above materials with one or two of N and C elements.

6. The method for making a phase change memory according to claim 1, wherein a material of the phase change material layer includes a sulfur-based compound material with phase change characteristics, the sulfur-based compound material includes one of $Sb_2Te_3$, $Sb_2Te$ and $Ge_2Sb_2Te_5$, or a compound obtained by doping one of $Sb_2Te_3$, $Sb_2Te$ and $Ge_2Sb_2Te_5$ with one or two of Ta, Hf and CTa, Hf and C elements.

7. The method for making a phase change memory according to claim 1, wherein a material of the first electrode material layer, the second electrode material layer, and the third electrode material layer respectively includes at least one of W, TiN, TiSiN, and AlN.

8. A phase change memory, comprising:
a substrate;
a plurality of phase change memory cells separately disposed on the substrate, each of the plurality of phase change memory cells sequentially includes, from bottom to top, a first electrode material layer, a first transition material layer, an OTS material layer, a second transition material layer, a second electrode material layer, a third transition material layer, a phase change material layer, a fourth transition material layer, and a third electrode material layer, wherein the first transition material layer consists of C, the second transition material layer consists of C, the third transition material layer consists of TaC, and the fourth transition material layer consists of TaC;
an isolation material layer disposed on the substrate and surrounding side surfaces of the plurality of phase change memory cells, and the plurality of phase change memory cells are isolated from each other by the isolation material layer.

9. The phase change memory according to claim 8, wherein in the phase change memory cell, cross-sectional areas of the phase change material layer and the OTS material layer are the same.

10. The phase change memory according to claim 8, wherein a material of the first transition material layer, the second transition material layer, the third transition material layer, and the fourth transition material layer respectively includes at least one of C, Ta, TaC, TaN, Nb, NbN, and SiC.

11. The phase change memory according to claim 8, wherein a thickness of the first transition material layer ranges from 2 to 10 nm, a thickness of the second transition material layer ranges from 2 to 10 nm, a thickness of the third transition material layer ranges from 2 to 10 nm, and a thickness of the fourth transition material layer ranges from 2 to 10 nm.

12. The phase change memory according to claim 8, wherein a material of the OTS material layer comprises a sulfur-based compound material with switching characteristics, the sulfur-based compound material includes one of Ge—Se series materials, Ge—As—Se series materials, Ge—As—Se—Si series materials, Ge—As—Se—Si—Te series materials, and Ge—As—Se—Si—N series materials, or a compound obtained by doping one of the series materials with one or two of N and C elements.

13. The phase change memory according to claim 8, wherein a material of the phase change material layer includes a sulfur-based compound material with phase change characteristics, the sulfur-based compound material includes one of $Sb_2Te_3$, $Sb_2Te$ and $Ge_2Sb_2Te_5$, or a compound obtained by doping one of the series materials with one or two of Ta, Hf and C.

14. The phase change memory according to claim 8, wherein a material of the first electrode material layer, the second electrode material layer, and the third electrode material layer respectively includes at least one of W, TIN, TiSiN, and AlN.

15. The method for making a phase change memory according to claim 5, wherein the OTS material layer is made of a compound consisting of elements Ge, As, Se, and Te.

16. The method for making a phase change memory according to claim 6, the phase change material layer is made of a compound consisting of elements Ta, Sb, and Te.

17. The method for making a phase change memory according to claim 1, a cross-section of each of the plurality of columnar structures is a square with a side length of 100 nm, and a distance between adjacent columnar structures is 100 nm.

* * * * *